US008630593B2

(12) United States Patent
Beamish et al.

(10) Patent No.: US 8,630,593 B2
(45) Date of Patent: Jan. 14, 2014

(54) SEMICONDUCTOR DEVICE, WIRELESS COMMUNICATION DEVICE AND METHOD FOR GENERATING A SYNTHESIZED FREQUENCY SIGNAL

(75) Inventors: Norman Beamish, Cork (IE); Niall Kearney, Killeagh (IE); Aidan Murphy, Innishannon (IE)

(73) Assignee: Freescale Semiconductor, Inc., Austin, TX (US)

( * ) Notice: Subject to any disclaimer, the term of this patent is extended or adjusted under 35 U.S.C. 154(b) by 141 days.

(21) Appl. No.: 13/059,085

(22) PCT Filed: Aug. 26, 2008

(86) PCT No.: PCT/IB2008/053415
§ 371 (c)(1),
(2), (4) Date: Feb. 15, 2011

(87) PCT Pub. No.: WO2010/023502
PCT Pub. Date: Mar. 4, 2010

(65) Prior Publication Data
US 2011/0151804 A1    Jun. 23, 2011

(51) Int. Cl.
*H04B 1/40* (2006.01)
(52) U.S. Cl.
USPC ............... 455/76; 455/258; 331/18; 332/128
(58) Field of Classification Search
None
See application file for complete search history.

(56) References Cited

U.S. PATENT DOCUMENTS

| | | | | |
|---|---|---|---|---|
| 4,914,405 A | * | 4/1990 | Wells | 331/25 |
| 4,965,533 A | * | 10/1990 | Gilmore | 331/25 |
| 5,757,239 A | * | 5/1998 | Gilmore | 331/18 |
| 2002/0183030 A1 | | 12/2002 | Damgaard et al. | |
| 2006/0170505 A1 | | 8/2006 | Humphreys et al. | |
| 2009/0072912 A1 | * | 3/2009 | Kim et al. | 331/16 |

FOREIGN PATENT DOCUMENTS

WO    2010/007471 A1    1/2010

OTHER PUBLICATIONS

Spataro et al., A VLSI CMOS Delay Oriented Waveform Converter for Polyphase Frequency Synthesizer, Mar. 2002, IEEE Journal of Solid-State Circuits, vol. 37, No. 3, pp. 1-6.*
International Search Report and Written Opinion correlating to PCT/IB2008/053415 dated Apr. 29, 2009.

* cited by examiner

*Primary Examiner* — Nay A Maung
*Assistant Examiner* — Alejandro Rivero (57) ABSTRACT

A semiconductor device comprises synthesized frequency generation logic arranged to receive a reference signal, and to provide an output frequency signal. The synthesized frequency generation logic comprises divider logic arranged to receive the reference signal and to generate a divided signal comprising a frequency with a period equal to N times that of the reference signal. The synthesized frequency generation logic is further arranged to generate the synthesized frequency signal comprising a frequency with a period equal to 1/M that of the divided signal. The synthesized frequency generation logic comprises or is operably coupled to decision logic module and comprises or is operably coupled to a switching logic module such that the decision logic module is arranged to determine whether a near-integer spur arises in using the synthesized frequency signal, and configures the switching logic module to select the synthesized frequency signal in response thereto.

18 Claims, 5 Drawing Sheets

FIG. 5

SEMICONDUCTOR DEVICE, WIRELESS COMMUNICATION DEVICE AND METHOD FOR GENERATING A SYNTHESIZED FREQUENCY SIGNAL

FIELD OF THE INVENTION

The field of this invention relates to a semiconductor device, and more particularly to a semiconductor device comprising synthesized frequency generation logic, and a method for generating a synthesized frequency signal.

BACKGROUND OF THE INVENTION

As radio frequency (RF) communication systems evolve, the range of frequency bands that transceivers within mobile communication devices are required to support continues to grow. Currently, a typical transceiver adapted to support communication within, for example, a Universal Mobile Telecommunications System (UMTS) may be required to support up to eleven distinct frequency bands.

Traditional frequency generation solutions utilise a Phase Locked Loop (PLL), which contains a Voltage Controlled Oscillator (VCO) that can be tuned over a range of frequencies. However, the cost of supporting a wide tuning range includes increased current consumption, a requirement for a higher quality of inductors that consume either significant amounts of silicon area or module board area, and increased design challenge to meet noise requirements simultaneously over all the supported frequency bands. Accordingly, in order to support the wide range of frequency bands required for UMTS transceivers and the like, conventional solutions require the use of two or more VCOs to provide two or more reference signals from which to generate required synthesized signals.

As will be appreciated, as process geometries shrink, the size of transistors within semiconductor devices is comparably becoming smaller. Conversely, the rate at which analogue components, such as capacitors and inductors, are becoming smaller is significantly less than the rate at which transistors are becoming smaller. The continual drive for reducing the size of integrated circuits and semiconductor devices has led to a need to develop systems and devices that take advantage of the greater rate of reduction in the size of transistors, and thus digital components, whilst minimising the effect of the relatively slow rate at which analogue components are becoming smaller.

As will also be appreciated, VCOs comprise analogue components, which have become relatively bulky in terms of integrated circuits and semiconductor devices. Furthermore, VCOs require relatively large inductors, thereby further increasing the silicon area taken up by the presence of VCOs. Thus, VCOs are relatively expensive in terms of silicon area of a semiconductor device, and therefore have a direct effect on the cost of producing the semiconductor devices, since the greater the silicon area of a device, the fewer devices that can be manufactured from a single wafer.

Figure 1:
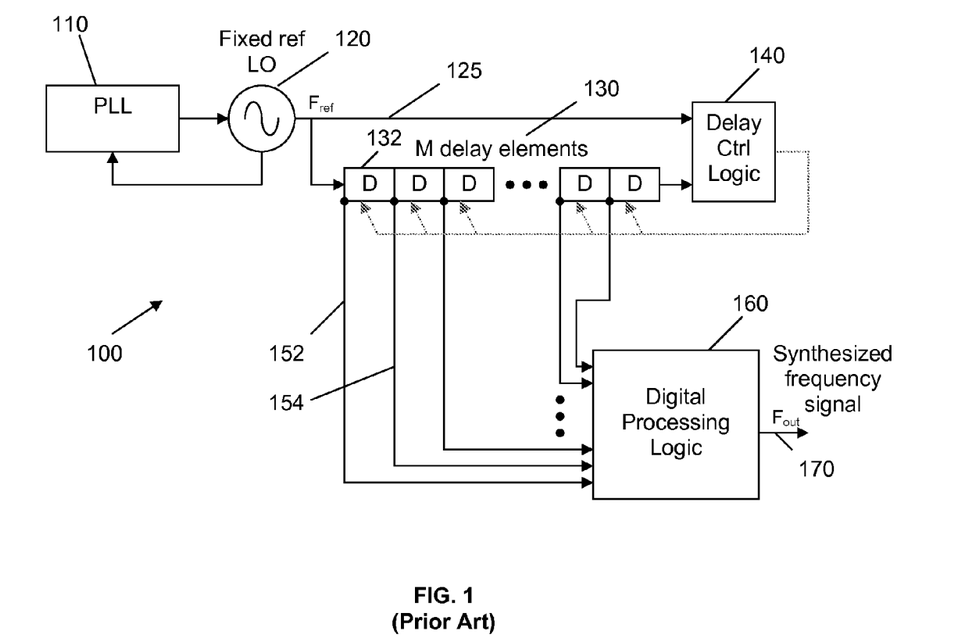
FIG. 1 illustrates a known system Delay Locked Loop Synthesizer.

FIG. 1 illustrates an example of a known Delay Locked Loop (DLL) Synthesizer 100, used to generate a plurality of synthesized frequency signals from a single VCO. The synthesizer 100 comprises a Phase-Locked Loop (PLL) 110, operably coupled to a local oscillator 120, for example a Voltage Controlled Oscillator (VCO). The PLL 110 is arranged to provide a control signal to the local oscillator 120, and as such to cause the local oscillator 120 to generate a fixed reference frequency signal $f_{ref}$ 125. The synthesizer 100 further comprises M delay elements 130, operably coupled to delay control logic 140. The first delay element 132 receives the fixed reference frequency signal $f_{ref}$ and introduces a delay 152 to the reference signal $f_{ref}$ 125. An identical delay 154 is subsequently introduced by each of the M delay elements 130. The length of the delay introduced by each delay element 130 may be defined as T/M, where T is the period of the fixed frequency signal $f_{ref}$ 125 generated by the local oscillator 120 and M is the number of delay elements. In this manner, the delay elements 130 output M component signals 150 with their corresponding edge transitions separated in time by T/M.

Thus, from a reference square wave signal in a form of the fixed reference frequency signal $f_{ref}$ generated by the local oscillator 120, the delay elements 130 generate M square waves, in the form of component signals 150, comprising transition edges offset in time relative to one another by a period of T/M. These component signals 150 are then provided to digital processing logic 160, which selects which of the component signals 150 to output at any one time, in order to generate the required synthesized frequency signal 170. Only one component signal 150 is ever connected to the output at one time. In this manner, the output synthesized frequency signal 170 is constructed from the components signals 150.

Figure 2:
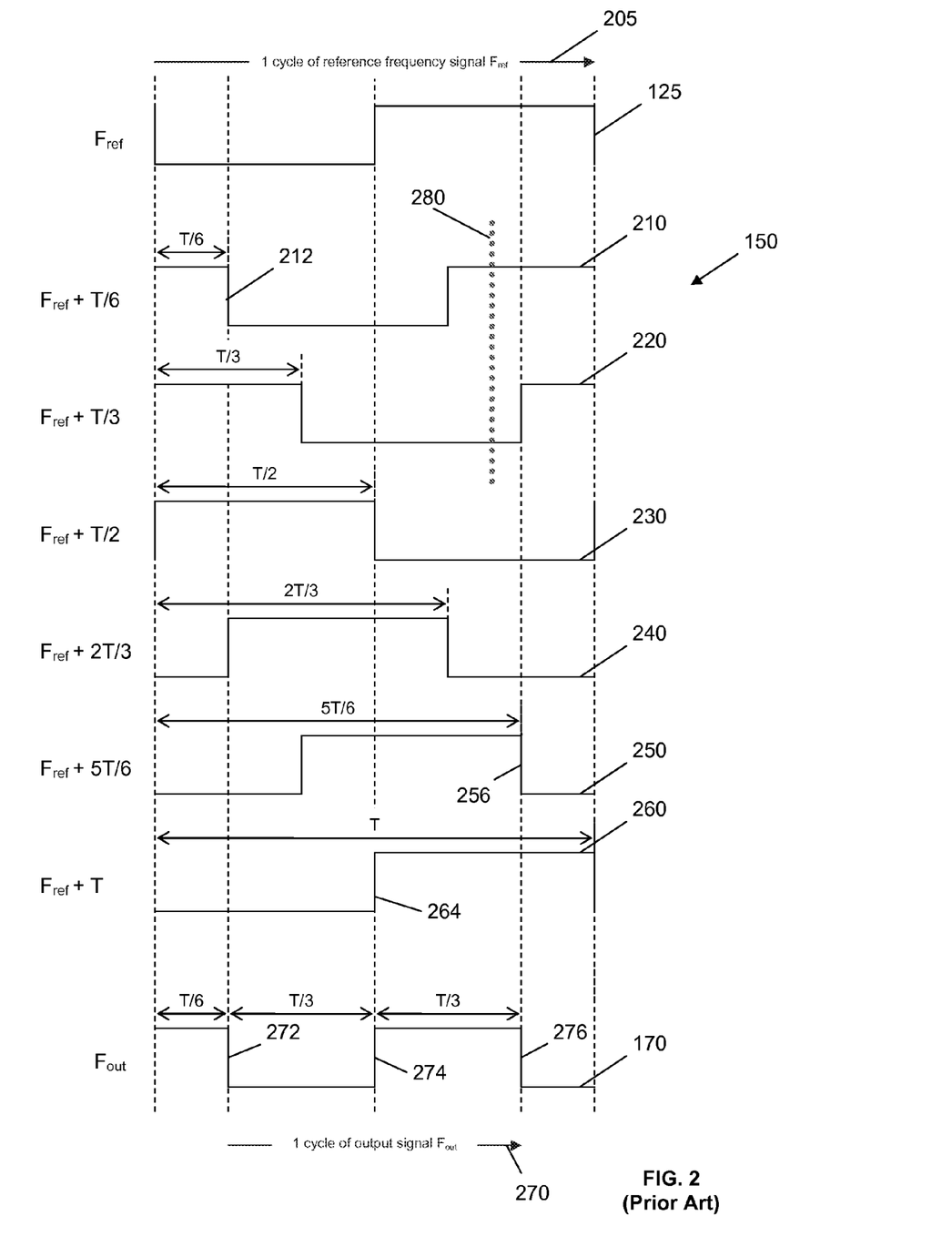
FIG. 2 illustrates a cycle of a synthesized frequency signal of the system Delay Locked Loop Synthesizer of FIG. 1.

FIG. 2 illustrates an example of a synthesized frequency signal 170 generated by the digital processing logic 160 of FIG. 1. As previously mentioned, the digital processing logic 160 receives the M component signals 150, and selects those component signals 150 to output at any one time, in order to generate the synthesized frequency signal $f_{out}$ 170. For the example illustrated in FIG. 2, M=6, and as such there are six component signals 210, 220, 230, 240, 250, 260 comprising edge transitions separated in time by T/6, where T is the period of a cycle 205 of the fixed frequency signal $f_{ref}$ 125. The digital processing logic 160 is arranged to generate a synthesized frequency signal 170 comprising a period of 2T/3. Accordingly, the digital processing logic 160 selects component signals to output that will provide edge transitions corresponding to a synthesized signal comprising a period of 2T/3. Thus, for the example illustrated in FIG. 2, the digital processing logic 160 is initially configured to output the component signal 210 comprising the fixed frequency signal $f_{ref}$ 125 delayed by T/6. In this manner, the synthesized frequency signal 170 comprises a falling edge transition 272 corresponding to a falling edge transition 212 of the selected component signal 210. The digital processing logic 160 then selects the component signal 260 comprising the fixed frequency signal $f_{ref}$ 125 delayed by T. In this manner, the synthesized frequency signal 170 comprises a subsequent rising edge transition 274 corresponding to the rising edge transition 264 of the selected component signal 260. The digital processing logic 160 then selects the component signal 250 comprising the fixed frequency signal $f_{ref}$ 125 delayed by 5T/6. In this manner, the synthesized frequency signal 170 comprises a subsequent falling edge transition 276 corresponding to the falling edge transition 256 of the selected component signal 250. As can be seen in FIG. 2, in this manner the digital processing logic 160 is able to select those component signals to output that provide edge transitions substantially T/3 apart, thus generating a synthesized frequency signal 170 comprising a period of 2T/3.

As will be appreciated, the use of such delay elements to progressively delay the fixed frequency signal $f_{ref}$ in this manner results in the quantisation in time of the fixed frequency signal $f_{ref}$. Thus, in this manner, the synthesizer 100 is able to generate multiple synthesized frequency signals using only a single VCO 120.

However, a problem with known DLL synthesizers, such as synthesizer 100 of FIG. 1, is that the quantisation in time of the fixed frequency signal $f_{ref}$ results in a creation of quantisation noise at synthesized frequencies requiring edge transitions that do not correspond precisely with those of the component signals. That is to say, if a required synthesized frequency signal comprises a period that is not a precise integer multiple of 2T/M, the edges of the required synthesized frequency signal will not coincide with edges of the component signals 150, and quantisation errors in time will occur. For example, if a desired synthesized frequency signal requires an edge that falls between the edges of adjacent component signals 150, for example as indicated at point 280 in FIG. 2, an instantaneous error due to quantisation of the time axis at this point will occur within the output synthesized frequency signal, resulting in frequency spurs within the output synthesized frequency signal.

It has been observed that when the VCO frequency is close to a harmonic of the reference frequency, a 'near-integer spur' arises. These spurs arise because either the VCO frequency or the transmit frequency is close to an integer multiple of the reference frequency that is used at the phase locked loop (PLL) input. In particular, the problem occurs specifically because harmonics of the phase detector output (n×fref) mix with the VCO signal that leaks back via power or other connections within the circuitry. These mixing products are low enough to pass through the loop filter passband and thereby modulate the VCO, thereby generating a spur.

One mechanism to address this problem would be to choose a reference frequency that is unable to generate a spur that will fall in the loop filter passband, for example by using a second crystal reference. However, such an approach is not attractive because it adds significant expense both in terms of cost and silicon area.

SUMMARY OF THE INVENTION

Embodiments of the invention provide a semiconductor device, a wireless communication device and a method for generating a synthesized frequency signal, as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF EMBODIMENTS OF THE INVENTION

Figure 3:
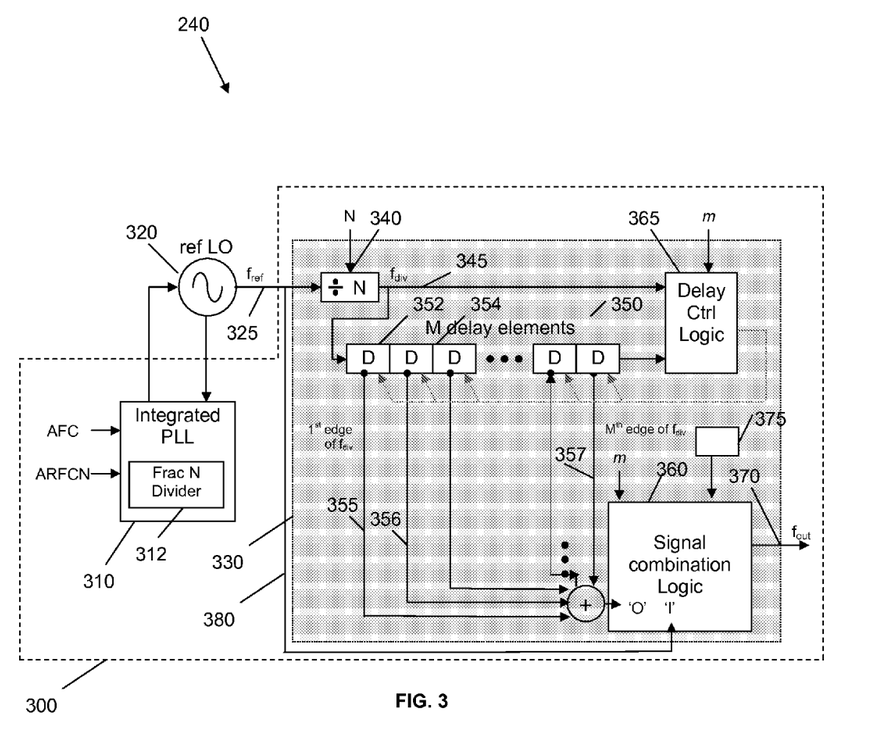
FIG. 3 illustrates an exemplary part of a semiconductor device comprising a hybrid DLL synthesizer.

Referring now to FIG. 3, there is illustrated an example of part of a semiconductor device 300 adapted according to an exemplary embodiment of the invention. The semiconductor device 300 comprises synthesized frequency generation logic 330 arranged to receive a reference signal ($f_{ref}$) 325, and to generate a synthesized frequency signal ($f_{out}$) 370 from the reference signal ($f_{ref}$) 325. The synthesized frequency generation logic 330 further comprises M delay elements 350, operably coupled to delay control logic 365. For the illustrated exemplary embodiment, the reference signal ($f_{ref}$) 325 is generated by way of a local oscillator 320, for example in the form of a Voltage Controlled Oscillator (VCO). The synthesized frequency generation logic 330 comprises a programmable divider logic 340 arranged to receive the reference signal 325 and to generate a divided signal ($f_{div}$) 345 comprising a frequency with a period substantially equal to N times that of the reference signal 325, where N comprises a programmable integer value. The synthesized frequency generation logic 330 is then arranged to generate the synthesized frequency signal 370 comprising a frequency with a period substantially equal to 1/M that of the divided signal ($f_{div}$) 345, where M may also comprise a programmable integer value.

In this manner, the programmable divider logic 340 enables the synthesized frequency generation logic 330 to generate synthesized frequency signals that are not limited to necessarily having edges that coincide with edges of the reference signal ($f_{ref}$) 325 that is generated by the local oscillator 320. Thus, the synthesized frequency generation logic 330 is not limited to generating synthesized frequency signals comprising frequencies equal to integer multiples (1/M) of the reference signal ($f_{ref}$) 325. Instead, the synthesized frequency generation logic 330 adapted according to exemplary embodiments of the invention is able to generate synthesized frequency signals ($f_{out}$) 370 comprising frequencies that have periods that are substantially equal to N/M that of the frequency of the reference signal 325. As previously mentioned, both N and M are programmable integers. Thus, from a single reference signal, the synthesized frequency generation logic 330 is able to be programmed to generate synthesized frequency signals ($f_{out}$) 370 comprising a greater range of frequencies than the prior art synthesizer of FIG. 1. Significantly, the synthesized frequency generation logic 330 disclosed herein does not introduce a significant amount of quantisation noise because the synthesized frequency generation logic 330 is locked to one cycle of the divided reference signal 345.

For the semiconductor device 300 illustrated in FIG. 3, the semiconductor device 300 further comprises programmable oscillator control logic 310, operably coupled to the local oscillator 320. The programmable oscillator control logic 310 is arranged to programmably control the frequency of the reference signal ($f_{ref}$) 325 that is generated by local oscillator 320. As will be appreciated, slight variations in the frequency of the reference signal ($f_{ref}$) 325 will have an effect on the synthesized frequency signal ($f_{out}$) 370 generated by the synthesized frequency generation logic 330. Thus, the programmable oscillator control logic 310 provides the ability to further vary the range of frequencies that the synthesized frequency generation logic 330 is able to generate.

For the illustrated exemplary embodiment, the programmable oscillator control logic 310 comprises a Phased-Locked Loop (PLL), programmable by way of a tuning control in the form of an Absolute Radio Frequency Channel Number (ARFCN) input signal. As will be appreciated, cellular communication networks communicate with wireless communication units over a range of carrier frequencies. For example, for a GSM (Global System for Mobile Communications) network, carrier frequencies are designated by an Absolute Radio Frequency Channel Number (ARFCN).

Similarly, for a UMTS network, carrier frequencies are specified by a UTRA (Universal Terrestrial Radio Access) Absolute Radio Frequency Channel Number (UARFCN). For simplicity, the term Absolute Radio Frequency Channel Number, and its acronym ARFCN, will hereinafter encompass UTRA Absolute Radio Frequency Channel Numbers (UARFCNs). In this manner, the programmable oscillator control logic 310 may be provided with an ARFCN for which a synthesized frequency signal is required to be generated, and using the ARFCN input signal, configure the local oscillator to generate an appropriate reference signal. For example, the PLL 310 may be programmed by controlling a divide ratio used by a fractional 'N' divider 312 within the PLL 310, whereby there is a direct relationship between each ARFCN and the necessary divide ratio.

In one exemplary embodiment of the invention, the programmable oscillator control logic 310 further comprises an Automatic Frequency Control (AFC) input signal. As will be appreciated, AFC is a mechanism for automatically maintaining a tuning of a signal to a desired frequency. For example, a circuit (not shown) develops an error voltage proportional to the degree to which, say, the oscillator 320 is mistuned. This error voltage may then be fed back to the programmable oscillator control logic 310 in the form of the AFC input signal, thereby enabling the oscillator control logic 310 to correct any error in the reference signal generated by the oscillator 320.

The synthesized frequency generation logic 330 of the illustrated exemplary embodiment is in a form of a Delay Locked Loop (DLL) comprising delay elements 350, operably coupled to the fixed divider logic 340. A first delay element 352 is arranged to receive the divided signal ($f_{div}$) 345 generated by the fixed divider logic 340, and to introduce a delay to the divided signal ($f_{div}$) 345 to generate a first component signal 355 comprising a delayed edge transition of the divided signal ($f_{div}$) 345 generated by the fixed divider logic 340. A substantially equal delay is subsequently introduced by each of the remaining delay elements 350, such that each of the delay elements 350 generates a component signal 355, 356, 357 comprising a correspondingly delayed edge transition of the divided signal ($f_{div}$) 345 generated by the fixed divider logic 340. The length of the delay introduced by each delay element 350 may be defined as T/M, where T is the period of the divided signal ($f_{div}$) 345 generated by the fixed divider logic 340, and M is the programmable number of component signals 355, 356, 357 generated by the delay elements 350. In this manner, the delay elements 350 are arranged to generate at least M component signals 355, 356, 357 comprising corresponding edge transitions separated in time by T/M, Accordingly, the first delay element 352 generates a first component signal 355 comprising the divided signal ($f_{div}$) 345 delayed by a period of T/M, a second delay element 354 generates a second component signal 356 comprising the first component signal 355 delayed by a period of T/M, and so on through to an $M^{th}$ delay element 350 generating an $M^{th}$ component signal 357 comprising the $(M-1)^{th}$ component signal delayed by a period of T/M. The component signals 355, 356, 357 are provided to digital processing logic, which for the illustrated exemplary embodiment comprises a form of signal combination logic 360, which generates the synthesized frequency signal $f_{out}$ 370 based at least partly on a combination of the component signals 355, 356, 357 provided thereto by selecting those component signals 355, 356, 357 to output at any one time.

Placing a DLL and a fixed divider logic 340 directly after the crystal 320 makes it possible to change the reference sent to the frequency generation system by a rational number factor. In accordance with exemplary embodiments of the invention, the semiconductor device 300 also combines this circuit with decision logic module 375 coupled to a multiplexer logic module 360. The decision logic module 375 is arranged to identify when a near-integer spur may occur.

In accordance with an exemplary embodiment, a 'near-integer' spur is considered as a frequency spur when the VCO oscillation frequency is separated from the closest harmonic of the reference frequency by a value smaller than the passband of the loop filter. In this case, the mixing product of the VCO and the reference harmonic is classified in exemplary embodiments of the invention as being a near-integer spur as it will be low enough in frequency to pass through the loop filter without being significantly attenuated and, hence, will directly modulate the VCO.

If the decision logic module 375 determines that a near-integer spur may not occur, the decision logic module 375 is configured to bypass the DLL circuit using path 380 and by appropriately configuring the switching (multiplexer) logic module 360. Alternatively, if the decision logic module 375 determines that a near-integer spur may occur, the decision logic module 375 is configured to engage the DLL structure by appropriately configuring the multiplexer logic module 360.

Thus, in this manner, exemplary embodiments provide a new way to dynamically deal with the problem of near-integer spurs, without compromising the design of other features of the frequency generation system. Furthermore, the fixed divider ratio and 'M' can be pre-selected for ease of implementation on the semiconductor device 300.

In an exemplary embodiment of the invention, only one frequency reference is generated at any given time and the DLL is arranged to be non-programmable. Thus, in this manner, the frequency generation circuit is optimised for just one alternative reference frequency and may require programmable dividers in the frequency generation system to automatically compensate for any reference changes when generating clocks to be used elsewhere within the system. In this manner, the DLL structure as shown gives the option to dynamically switch the reference frequency by a rational number (N/M) when the VCO frequency may give rise to spurs.

Although the exemplary embodiments described with reference to FIG. 3 illustrate the synthesized frequency generation logic 330 comprises decision logic module 375 and switching logic module 360, it is envisaged that in alternative exemplary embodiments the synthesized frequency generation logic 330 may be operably coupled to distinct decision logic module and/or switching logic module. Furthermore, in yet further alternative exemplary embodiments it is envisaged that the synthesized frequency generation logic 330 may be operably coupled to distinct decision logic module and/or switching logic module located on a separate semiconductor device.

Accordingly, whilst the semiconductor device according to the illustrated exemplary embodiments comprises a synthesized frequency generation logic of increased complexity compared to that of the prior art, the reduction in the number of analogue components such as VCOs and inductors that would otherwise be necessary in order to support the required range of frequency bands provides a significant improvement in terms of silicon area requirements, and thus provides a significant increase in the number of such semiconductor devices that can be produced from a single wafer, thereby resulting in a significant reduction in the cost of manufacture for such semiconductor devices.

Figure 4:
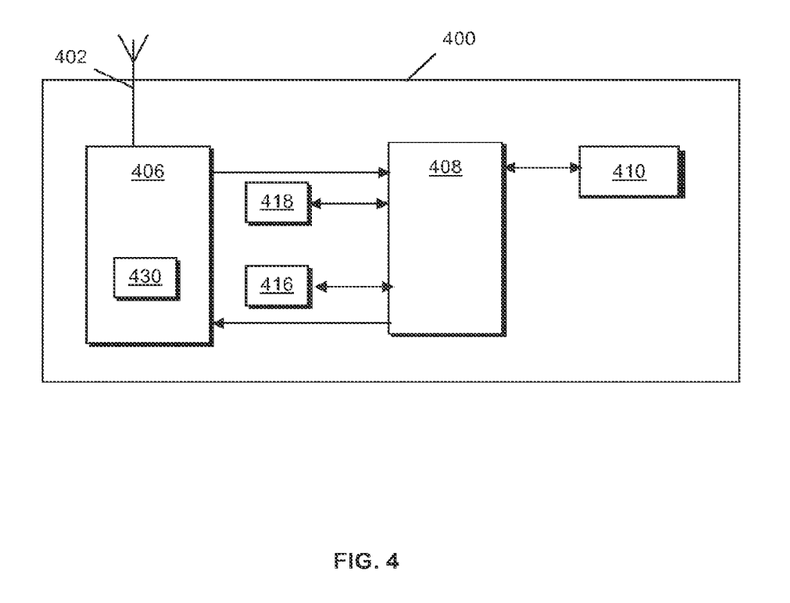
FIG. 4 illustrates an exemplary flowchart of a method for generating a synthesized frequency signal.

Referring to FIG. 4, there is illustrated a block diagram of part of a wireless communication device 400, adapted to support exemplary embodiments of the invention. The wireless communication device 400, in the context of the illustrated exemplary embodiment of the invention, is a mobile telephone handset comprising an antenna 402. As such, the communication device 400 contains a variety of well known radio frequency components or circuits 406, operably coupled to the antenna 402. The radio frequency components or circuits 406 of the communication device 400, in accordance with some exemplary embodiments of the invention, comprise a semiconductor device 430, for example similar to the semiconductor device 300 of FIG. 3. In particular, the semiconductor device 430 comprises synthesized frequency generation logic arranged to receive a reference signal, and to generate a synthesized frequency signal from the reference signal; the synthesized frequency generation logic comprises fixed divider logic arranged to receive the reference signal and to generate, in a first mode of operation, a divided signal comprising a frequency with a period substantially equal to N times that of the reference signal, where N comprises a programmable integer value; and the synthesized frequency generation logic is arranged to generate the synthesized frequency signal comprising a frequency substantially equal to M times that of the divided signal. Thus, in the first mode of operation, the generated synthesized frequency signal is selected when it is determined that a near-integer spur may occur. In a second mode of operation, the DLL circuit is bypassed when it is determined that a near-integer spur may not occur, as described with reference to FIG. 3.

For completeness, the wireless communication device 400 further comprises signal processing logic 408. An output from the signal processing logic 408 is provided to a suitable user interface (UI) 410 comprising, for example, a display, keypad, loudspeaker and/or microphone. The signal processing logic 408 is coupled to a memory element 416 that stores operating regimes, such as decoding/encoding functions and the like and may be realised in a variety of technologies such as random access memory (RAM) (volatile), (non-volatile) read only memory (ROM), Flash memory or any combination of these or other memory technologies. A timer 418 is typically coupled to the signal processing logic 408 to control the timing of operations within the wireless communication device 400.

Figure 5:
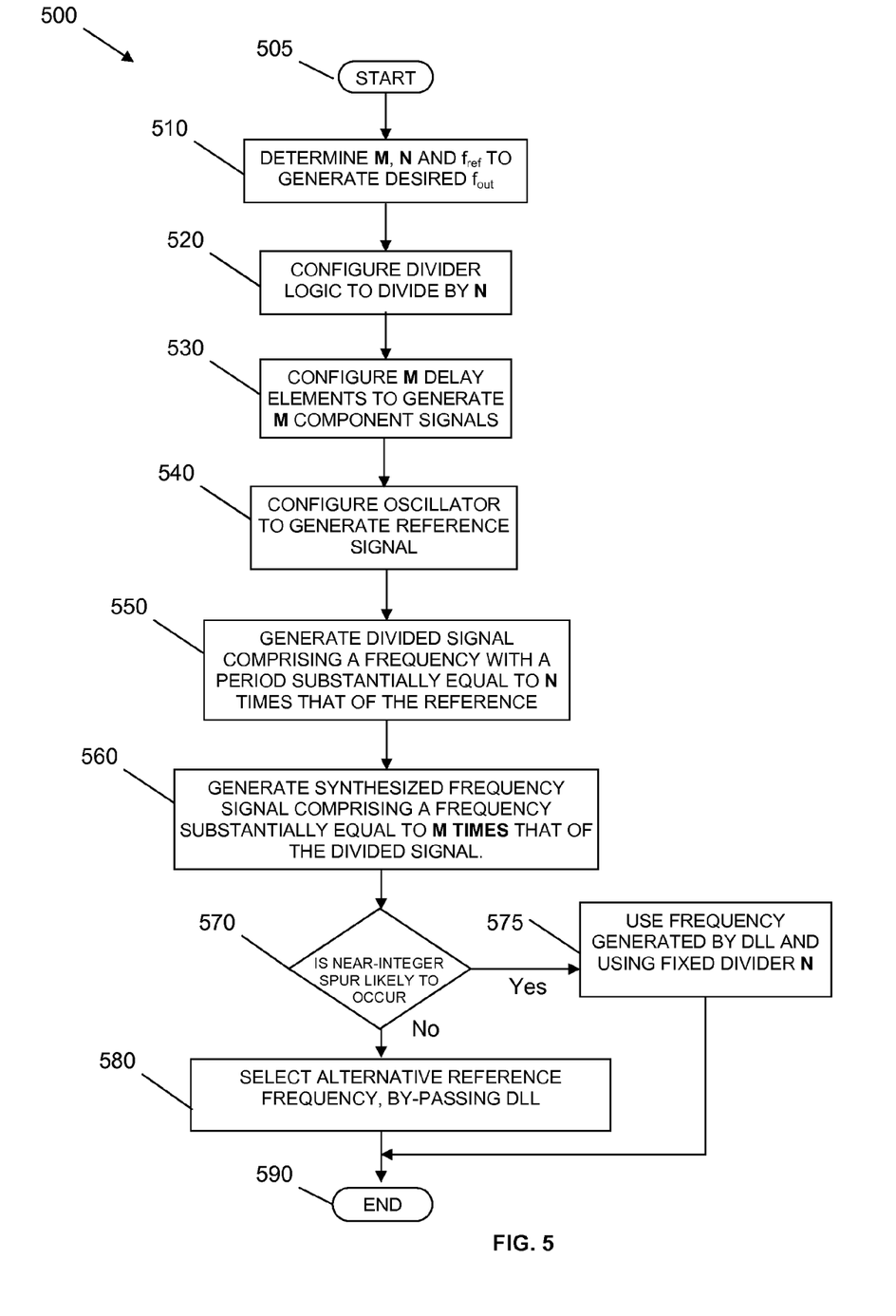
FIG. 5 illustrates and exemplary flowchart of a method for generating a synthesized frequency signal.

Referring now to FIG. 5, there is illustrated an example of a flowchart 500 of a method for generating a synthesized frequency signal according to some exemplary embodiments of the invention. The method starts at step 505, and moves to step 510 where the variables M and N, and in some exemplary embodiments of the invention the reference signal ($f_{ref}$), required for generating a desired synthesized frequency signal ($f_{out}$) are determined. For example, a tuning control word, or other variable reference, corresponding to a desired synthesized frequency signal $f_{out}$ may be retrieved from a memory element.

Next, in step 520, divider logic is configured to divide a received reference signal ($f_{ref}$) by N. M delay elements are then configured to generate M component signals, in step 530. For some exemplary embodiments, the next step, step 540, comprises configuring a local oscillator to generate the required reference signal ($f_{ref}$). Next, in step 550, a divided signal comprises a frequency with a period substantially equal to N times that of the reference signal is then generated, and a synthesized frequency signal comprising a frequency substantially equal to M times that of the divided signal is generated in step 560.

In accordance with an exemplary embodiment of the invention, the method then determines whether a near-integer spur may occur, as shown in step 570. If it is determined that a near-integer spur may occur in step 570, the method moves onto step 575 where the frequency generated using the fixed divider and DLL circuit is used. The method then ends at step 590. If it is determined that a near-integer spur may not occur in step 570, the method moves onto step 580 where the reference frequency is used, thereby by-passing the fixed divider and DLL circuit. The method then ends at step 590.

In the foregoing specification, the invention has been described with reference to specific examples of embodiments of the invention. It will, however, be evident that various modifications and changes may be made therein without departing from the broader spirit and scope of the invention as set forth in the appended claims.

The semiconductor substrate described herein can be any semiconductor material or combinations of materials, such as gallium arsenide, silicon germanium, silicon-on-insulator (SOI), silicon, monocrystalline silicon, the like, and combinations of the above.

Because the apparatus implementing the invention is, for the most part, composed of electronic components and circuits known to those skilled in the art, circuit details will not be explained in any greater extent than that considered necessary as illustrated above, for the understanding and appreciation of the underlying concepts of the invention and in order not to obfuscate or distract from the teachings of the present invention.

It is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediary components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device. Also, devices functionally forming separate devices may be integrated in a single physical device.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps than those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A method for generating a frequency signal, the method comprising:
   receiving, at a synthesized frequency generator, a reference signal;
   generating a divided signal based upon the reference signal, the divided signal having a period equal to N times that of the reference signal;
   generating a synthesized frequency signal based upon the divided signal, the synthesized frequency signal having a period equal to 1/M that of the divided signal;
   determining whether a near-integer spur arises in using the synthesized frequency signal;
   selecting the synthesized frequency signal in response to determining that the near-integer spur arises; and
   bypassing the synthesized frequency signal in response to determining that a near-integer spur does not arise.

2. The method of claim 1:
   N is a variable integer; and
   the method further comprises receiving a value for the variable integer.

3. The method of claim 1 wherein the near-integer spur comprises a frequency spur generated when an oscillation frequency is separated from a closest harmonic of a crystal reference signal by a value smaller than a passband of a loop filter of the synthesized frequency generation logic.

4. The method of claim 1 wherein the synthesized frequency generator comprises a Delay-Locked Loop (DLL).

5. The method of claim 1 wherein the reference signal is a variable frequency reference signal.

6. A semiconductor device comprising:
   synthesized frequency generation logic arranged to receive a reference signal, and
      provide an output frequency signal; and
   wherein,
      the synthesized frequency generation logic comprises
         divider logic arranged to receive the reference signal and to generate a divided signal comprising a frequency with a period equal to N times that of the reference signal,
         the synthesized frequency generation logic further arranged to generate, from the divided signal, a synthesized frequency signal comprising a frequency with a period equal to 1/M that of the divided signal,
         the synthesized frequency generation logic further comprises a decision logic module and a switching logic module such that the decision logic module is arranged to determine whether a near-integer spur arises in using the synthesized frequency signal and configures the switching logic module to select the synthesized frequency signal as the output frequency signal in response thereto, and
         the decision logic response is further arranged to configure the switching logic module to select another output frequency as the output frequency signal and bypass the synthesized frequency generation logic in response to determining that a near-integer spur does not arise.

7. The semiconductor device of claim 6 wherein the selected output frequency is a frequency of the reference signal.

8. The semiconductor device of claim 6 wherein the divider logic comprises fixed divider logic arranged to receive the reference signal and to generate a fixed divided signal.

9. The semiconductor device of claim 6 wherein the near-integer spur comprises a frequency spur generated when an oscillation frequency is separated from a closest harmonic of a crystal reference signal by a value smaller than a passband of a loop filter of the synthesized frequency generation logic.

10. The semiconductor device of claim 6 wherein the synthesized frequency generation logic comprises a Delay-Locked Loop (DLL).

11. The semiconductor device of claim 6 wherein the semiconductor device further comprises:
    radio frequency (RF) transceiver circuitry arranged to support RF communication within a Universal Mobile Telecommunications System (UMTS).

12. The semiconductor device of claim 6 wherein the reference signal is a variable frequency reference signal.

13. A wireless communication device comprising synthesized frequency generation logic arranged to receive a reference signal and to provide an output frequency signal, the synthesized frequency generation logic comprising:
    a divider module;
    a delay-locked loop (DLL) synthesizer module;
    a switching module; and
    a decision module;
    wherein:
       the divider module is arranged to receive the reference signal and to generate a divided signal, the divided signal having a period equal to N times that of the reference signal,
       the DLL synthesizer module is arranged to receive the divided signal and to generate a synthesized frequency signal comprising a frequency with a period equal to 1/M that of the divided signal,
       the decision module is arranged to determine whether a near-integer spur arises in using the synthesized frequency signal; and
       the switching module is arranged to
          select the synthesized frequency signal as the output frequency signal when the decision module determines that a near-integer spur arises in using the synthesized frequency signal, and
          select another output frequency signal and bypass the synthesized frequency generation logic when the decision module determines that a near-integer spur has not arisen.

14. The wireless communication device of claim 13 wherein the selected output frequency signal is a frequency of the reference signal.

15. The wireless communication device of claim 13 wherein the divider module comprises fixed divider logic arranged to receive the reference signal and to generate a fixed divided signal.

16. The wireless communication device of claim 13 wherein the near-integer spur comprises a frequency spur generated when an oscillation frequency is separated from a closest harmonic of a crystal reference signal by a value smaller than a passband of a loop filter of the synthesized frequency generation logic.

17. The wireless communication device of claim 13 wherein the semiconductor device further comprises:
   radio frequency (RF) transceiver circuitry arranged to support RF communication within a Universal Mobile Telecommunications System (UMTS).

18. The wireless communication device of claim 13 wherein the reference signal is a variable frequency reference signal.

\* \* \* \* \*